United States Patent
Johanson et al.

(10) Patent No.: US 12,014,906 B2
(45) Date of Patent: Jun. 18, 2024

(54) HIGH TEMPERATURE DETACHABLE VERY HIGH FREQUENCY (VHF) ELECTROSTATIC CHUCK (ESC) FOR PVD CHAMBER

(71) Applicant: Applied Materials, Inc., Santa Clara, CA (US)

(72) Inventors: William R. Johanson, Gilroy, CA (US); Keith A. Miller, Mountain View, CA (US); Cheng-Hsiung Matthew Tsai, Cupertino, CA (US); John C. Forster, Mountain View, CA (US); Mukund Sundararajan, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 280 days.

(21) Appl. No.: 17/530,809

(22) Filed: Nov. 19, 2021

(65) Prior Publication Data
US 2023/0162954 A1  May 25, 2023

(51) Int. Cl.
*H01J 37/32* (2006.01)
*H01J 37/34* (2006.01)

(52) U.S. Cl.
CPC ... *H01J 37/32724* (2013.01); *H01J 37/32082* (2013.01); *H01J 37/34* (2013.01); *H01J 2237/002* (2013.01); *H01J 2237/2007* (2013.01); *H01J 2237/332* (2013.01)

(58) Field of Classification Search
CPC ... H02N 13/00; H01L 21/686; H01L 21/6833; H01J 37/32724; H01J 37/32082; H01J 2237/002; H01J 2237/2007; H01J 37/32715

USPC ............................................ 361/234
See application file for complete search history.

(56) References Cited

U.S. PATENT DOCUMENTS

| | | | |
|---|---|---|---|
| 5,671,116 A | 9/1997 | Husain | |
| 5,691,876 A | 11/1997 | Chen et al. | |
| 5,796,074 A * | 8/1998 | Edelstein | C23C 14/50 219/390 |
| 7,589,950 B2 | 9/2009 | Parkhe et al. | |
| 7,697,260 B2 | 4/2010 | Brown et al. | |
| 9,666,467 B2 | 5/2017 | Parkhe | |

(Continued)

OTHER PUBLICATIONS

PCT International Search Report and Written Opinion for PCT/US2022/036414 dated Oct. 18, 2022.

*Primary Examiner* — Danny Nguyen
(74) *Attorney, Agent, or Firm* — Moser Taboada

(57) ABSTRACT

Embodiments of substrate supports for use in substrate processing chambers are provided herein. In some embodiments, a substrate support includes: an upper assembly having a base plate assembly coupled to a lower surface of a cooling plate, wherein the base plate assembly includes a plurality of electrical feedthroughs, and wherein the cooling plate includes a plurality of openings aligned with the plurality of electrical feedthroughs; an electrostatic chuck disposed on the upper assembly and removably coupled to the cooling plate, wherein the electrostatic chuck has a chucking electrode disposed therein that is electrically coupled to a first pair of electrical feedthroughs of the plurality of electrical feedthroughs; and an inner tube coupled to the cooling plate and configured to provide an RF delivery path to the electrostatic chuck.

20 Claims, 6 Drawing Sheets

(56) References Cited

U.S. PATENT DOCUMENTS

| | | | |
|---|---|---|---|
| 2010/0039747 A1* | 2/2010 | Sansoni | H01L 21/67103 |
| | | | 361/234 |
| 2012/0033340 A1 | 2/2012 | Roy et al. | |
| 2020/0411354 A1 | 12/2020 | Rao et al. | |
| 2021/0175107 A1 | 6/2021 | Savandaiah et al. | |

* cited by examiner

HIGH TEMPERATURE DETACHABLE VERY HIGH FREQUENCY (VHF) ELECTROSTATIC CHUCK (ESC) FOR PVD CHAMBER

FIELD

Embodiments of the present disclosure generally relate to substrate processing equipment.

BACKGROUND

Substrate supports are used for providing support to substrates within substrate processing systems, such as a plasma processing chamber. A type of substrate support includes an electrostatic chuck (ESC) coupled to a lower assembly. An ESC generally includes one or more electrodes embedded within a ceramic chuck body to retain a substrate. An ESC may be detachable from the lower assembly to reduce preventative maintenance time and reduce cost of replacement. However, conventional ESCs are not efficient at RF frequencies around 60 MHz combined with higher temperatures (>400 degrees Celsius). At such frequencies and temperatures, the ESC has a high impedance that prevents efficient RF delivery through the ESC and leads to lower throughput.

Accordingly, the inventors have provided improved substrate supports for use with high RF frequencies.

SUMMARY

Embodiments of substrate supports for use in substrate processing chambers are provided herein. In some embodiments, a substrate support for use in a substrate processing chamber includes: an upper assembly having a base plate assembly coupled to a lower surface of a cooling plate, wherein the base plate assembly includes a plurality of electrical feedthroughs, and wherein the cooling plate includes a plurality of openings aligned with the plurality of electrical feedthroughs; an electrostatic chuck disposed on the upper assembly and removably coupled to the cooling plate, wherein the electrostatic chuck has a chucking electrode disposed therein that is electrically coupled to a first pair of electrical feedthroughs of the plurality of electrical feedthroughs; and an inner tube coupled to the cooling plate and configured to provide an RF delivery path to the electrostatic chuck via at least one of: a gap between the electrostatic chuck and the cooling plate, or backside metallization of the electrostatic chuck.

In some embodiments, a substrate support for use in a substrate processing chamber, includes: an upper assembly having a base plate assembly coupled to a cooling plate, wherein the base plate assembly includes a plurality of electrical feedthroughs disposed about a backside gas opening, and wherein the cooling plate includes a plurality of openings aligned with the plurality of electrical feedthroughs; an electrostatic chuck disposed on the upper assembly and removably coupled to the cooling plate, wherein the electrostatic chuck has an electrode disposed therein that is electrically coupled to a first pair of electrical feedthroughs of the plurality of electrical feedthroughs; an inner tube coupled to the cooling plate and configured to provide an RF delivery path to the electrostatic chuck via at least one of: a gap between the electrostatic chuck and the cooling plate, or backside metallization of the electrostatic chuck; and a first resistive heater embedded in the electrostatic chuck and electrically coupled to a second pair of the electrical feedthroughs.

In some embodiments, a process chamber, includes: a chamber body having a substrate support disposed within an inner volume of the chamber body, wherein the substrate support comprises: an upper assembly having a base plate assembly coupled to a cooling plate, wherein the base plate assembly includes a plurality of electrical feedthroughs disposed about a backside gas opening, and wherein the cooling plate includes a plurality of openings aligned with the plurality of electrical feedthroughs; an electrostatic chuck disposed on the upper assembly and removably coupled to the cooling plate, wherein the electrostatic chuck has an electrode disposed therein that is electrically coupled to a first pair of electrical feedthroughs of the plurality of electrical feedthroughs; and a support assembly having an inner tube coupled to the cooling plate and configured to provide an RF delivery path to the electrostatic chuck via at least one of: a gap between the electrostatic chuck and the cooling plate, or backside metallization of the electrostatic chuck.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
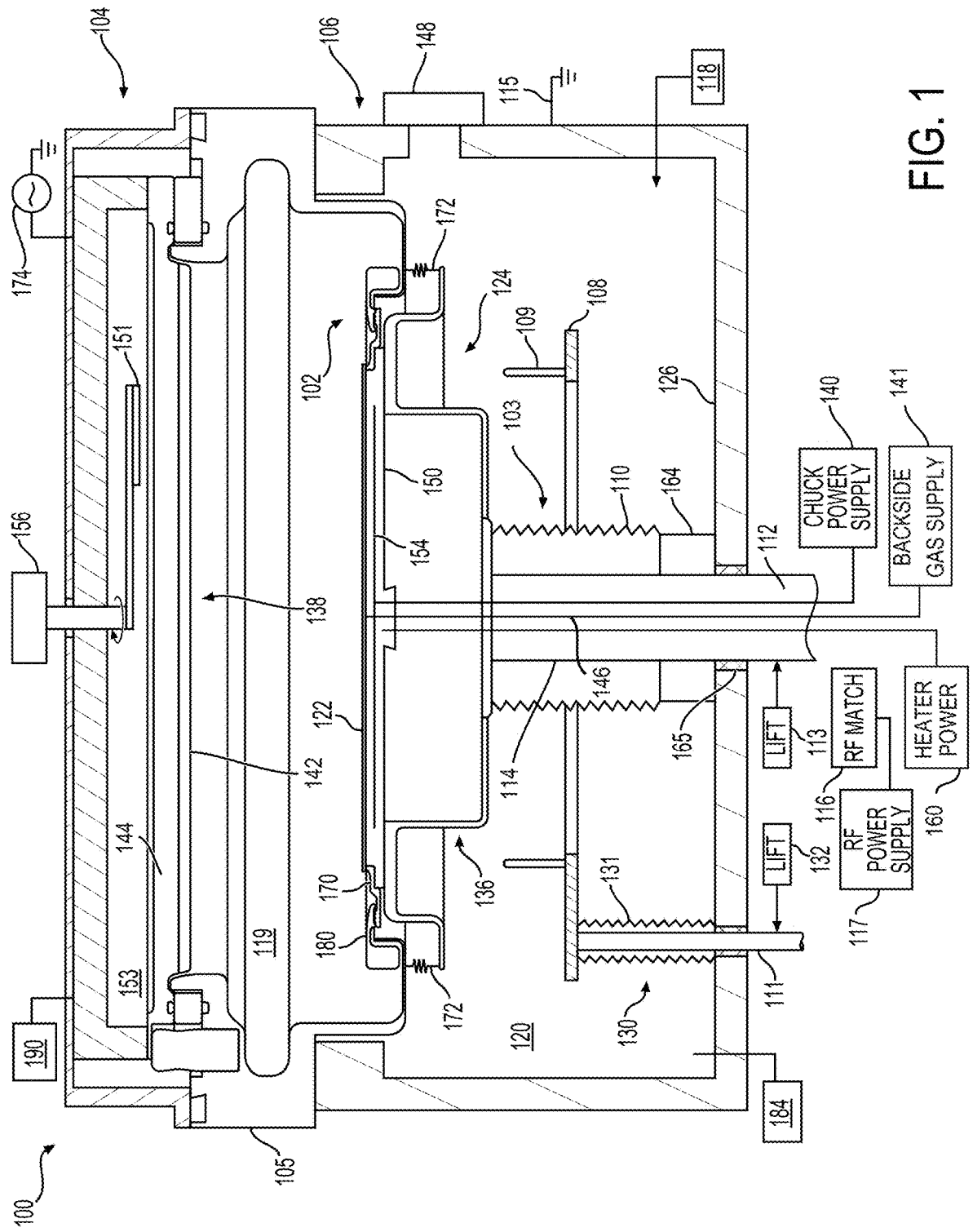
FIG. 1 depicts a schematic side view of a process chamber having a substrate support in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of detachable electrostatic chucks (ESC) for physical vapor deposition (PVD) chambers operating at very high RF frequencies are provided herein. Very high RF frequencies may, for example, be about 40 MHz or more, or about 60 MHz or more. The inventors have found that PVD chambers operating at very high frequencies may advantageously lower resistivity of film being deposited therein. The ESC may also operate at high temperatures (about 400 degrees Celsius or more).

FIG. 1 depicts a schematic side view of a process chamber 100 having a substrate support in accordance with at least some embodiments of the present disclosure. In some embodiments, the process chamber 100 is a PVD chamber. However, other types of processing chambers configured for different processes can also use or be modified for use with embodiments of the electrostatic chuck described herein.

The process chamber 100 is a vacuum chamber which is suitably adapted to maintain sub-atmospheric pressures within an interior volume 120 of the process chamber 100 during substrate processing. The process chamber 100 includes a chamber body 106 covered by a lid 104 which encloses a processing volume 119 located in the upper half of the interior volume 120. The process chamber 100 may also include a process shield 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise an electrostatic chuck 150 disposed on a pedestal 136. The electrostatic chuck 150 may be made of a ceramic material. The pedestal 136 is coupled to a support assembly 103 for supporting the pedestal 136 and the electrostatic chuck 150.

The support assembly 103 generally includes an inner tube 112 that is hollow and a bellows assembly 110 disposed about the inner tube 112. The inner tube 112 is configured to provide an RF delivery path from the RF bias power supply 117 to the electrostatic chuck 150. The inner tube 112 also provides a conduit to provide, for example, backside gases, process gases, fluids, coolants, power, auto capacitive tuner (ACT), or the like, to the electrostatic chuck 150. The bellows assembly 110 may include an outer tube 114 disposed about the inner tube 112. In some embodiments, the outer tube 114 is configured to provide an RF return path from the pedestal 136. In some embodiments, a lower end of the inner tube 112 may protrude beyond a lower end of the outer tube 114 to facilitate electrical connection to the inner tube 112 and the outer tube 114.

The electrostatic chuck 150 includes one or more chucking electrodes 154 disposed therein. A temperature of the electrostatic chuck 150 may be adjusted to control the temperature of the substrate 122. For example, the electrostatic chuck 150 may be heated using one or more heating elements (e.g., see FIG. 5) that are embedded, such as a resistive heater. In some embodiments, a thickness of the electrostatic chuck 150 may be about 6.0 mm or less.

In some embodiments, the inner tube 112 is coupled to a lift mechanism 113, such as an actuator or motor, which provides vertical movement of the electrostatic chuck 150 between an upper, processing position (as shown in FIG. 1) and a lower, transfer position (not shown).

The bellows assembly 110 is coupled between the electrostatic chuck 150 and a bottom surface 126 of process chamber 100 to provide a flexible seal that allows vertical motion of the electrostatic chuck 150 while preventing loss of vacuum from within the process chamber 100. The bellows assembly 110 may also include a lower bellows flange 164 in contact with an o-ring 165 or other suitable sealing element which contacts the bottom surface 126 to help prevent loss of chamber vacuum. The bellows assembly 110 may facilitate or partially define an RF return path from the lower assembly 220.

The inner tube 112 provides a conduit for coupling a backside gas supply 141, a chucking power supply 140, a heater power supply 160, to the electrostatic chuck 150. The backside gas supply 141 is disposed outside of the chamber body 106 and supplies gas to the electrostatic chuck 150 via a gas conduit 146 to control the temperature or pressure and/or a temperature profile or pressure profile on the support surface of the electrostatic chuck 150 during use. In some embodiments, RF power supply 174 and RF bias power supply 117 are coupled to the electrostatic chuck 150 via respective RF match networks (only RF match network 116 shown). In some embodiments, the substrate support 124 may alternatively include AC, DC, or RF bias power.

The RF delivery path and the RF return path are arranged in a coaxial manner along the support assembly 103. For example, the RF delivery path extends along the inner tube 112, which acts as an RF electrode. The inner tube 112 may be maintained at a constant temperature. The RF return path extends along the outer tube 114 disposed about the inner tube 112. The arrangement of the inner tube 112 and the outer tube 114 creates a neutral or field free region within the inner tube 112, reducing RF loses due to RF coupling of electrostatic chuck wires, heater wires, thermocouple wires, and the like.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the process chamber vacuum during vertical motion of the substrate lift 130.

The process chamber 100 is coupled to and in fluid communication with a vacuum system 184 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases to the process chamber 100 for processing the substrate 122 disposed therein.

A target 138 is disposed in the processing volume 119 opposite the substrate support 124 to at least partially define a process volume therebetween. The target 138 includes a cathode surface defined by processing volume facing surfaces of the target 138. The substrate support 124 has a support surface having a plane substantially parallel to a sputtering surface of the target 138. The target 138 is connected to one or both of a DC power source 190 and/or the RF power supply 174. The DC power source 190 can apply a bias voltage to the target 138 relative to the process shield 105.

The target 138 comprises a sputtering plate 142 mounted to a backing plate 144. The sputtering plate 142 comprises a material to be sputtered onto the substrate 122. The backing plate 144 is made from a metal, such as, for example, stainless steel, aluminum, copper-chromium or copper-zinc. The backing plate 144 can be made from a material having a thermal conductivity that is sufficiently high to dissipate the heat generated in the target 138, which form from eddy currents that arise in the sputtering plate 142 and the backing plate 144 and also from the bombardment of energetic ions from generated plasma onto the sputtering plate 142.

In some embodiments, the process chamber 100 includes a magnetic field generator 156 to shape a magnetic field about the target 138 to improve sputtering of the target 138. The capacitively generated plasma may be enhanced by the magnetic field generator 156 in which, for example, a plurality of magnets 151 (e.g., permanent magnet or electromagnetic coils) may provide a magnetic field in the process chamber 100 that has a rotating magnetic field having a rotational axis that is perpendicular to the plane of the substrate 122. The magnetic field generator 156 may include a motor assembly that rotates the plurality of magnets 151. The magnetic field generator 156 may generates a magnetic field near the target 138 to increase an ion density in the processing volume 119 to improve the sputtering of the target material. The plurality of magnets 151 may be disposed in a cavity 153 in the lid 104. A coolant such as water may be disposed in or circulated through the cavity 153 to cool the target 138.

The process chamber 100 includes a process kit 102 circumscribing various chamber components to prevent unwanted reaction between such components and ionized process material. The process kit 102 includes a process shield 105 surrounding the substrate support 124 and the target 138 to at least partially define the processing volume 119. For example, the process shield 105 may define an outer boundary of the processing volume 119. In some embodiments, the process shield 105 is made of a metal such as aluminum.

In some embodiments, the process kit 102 includes a deposition ring 170 that rests on an outer edge of the electrostatic chuck 150. In some embodiments, the process kit 102 includes a cover ring 180 disposed on the process shield 105 to form a tortuous gas flow path therebetween. In some embodiments, in the processing position, a radially inner portion of the cover ring 180 rests on the deposition ring 170 to reduce or prevent plasma leak therebetween.

In some embodiments, a plurality of ground loops 172 are disposed between the process shield 105 and the pedestal 136. The ground loops 172 may generally comprise a loop of conductive material, or alternatively, conductive straps, spring members, or the like, configured to ground the process shield 105 to the pedestal 136 when the substrate support 124 is in the processing position. In some embodiments, the plurality of ground loops 172 are coupled to an outer lip of the pedestal 136 so that in the processing position, the ground loops 172 contact the process shield 105 to ground the process shield 105. In some embodiments, in the transfer position, the ground loops 172 are spaced from the process shield 105.

The process chamber 100 is coupled to and in fluid communication with a vacuum system 19 which includes a throttle valve (not shown) and vacuum pump (not shown) which are used to exhaust the process chamber 100. The pressure inside the process chamber 100 may be regulated by adjusting the throttle valve and/or vacuum pump. The process chamber 100 is also coupled to and in fluid communication with a process gas supply 118 which may supply one or more process gases to the process chamber 100 for processing the substrate 122 disposed therein. A slit valve 148 may be coupled to the chamber body 106 and aligned with an opening in a sidewall of the chamber body 106 to facilitate transferring the substrate 122 into and out of the chamber body 106.

In use, while the DC power source 190 supplies power to the target 138 and other chamber components connected to the DC power source 190, the RF power supply 174 energizes the sputtering gas (e.g., from the process gas supply 118) to form a plasma of the sputtering gas. The plasma formed impinges upon and bombards the sputtering surface of the target 138 to sputter material off the target 138 onto the substrate 122. In some embodiments, RF energy supplied by the RF power supply 174 may range in frequency from about 2 MHz to about 60 MHz or greater. In some embodiments, a plurality of RF power sources may be provided (i.e., two or more) to provide RF energy in a plurality of the above frequencies. An additional RF power source, (e.g., RF bias power supply 117) can also be used to supply a bias voltage to the substrate support 124 to attract ions from the plasma towards the substrate 122. The RF bias power supply 117 may supply RF power in a very high frequency range, for example, about 13 MHz or greater, or about 40 or about 60 MHz or greater.

Figure 2:
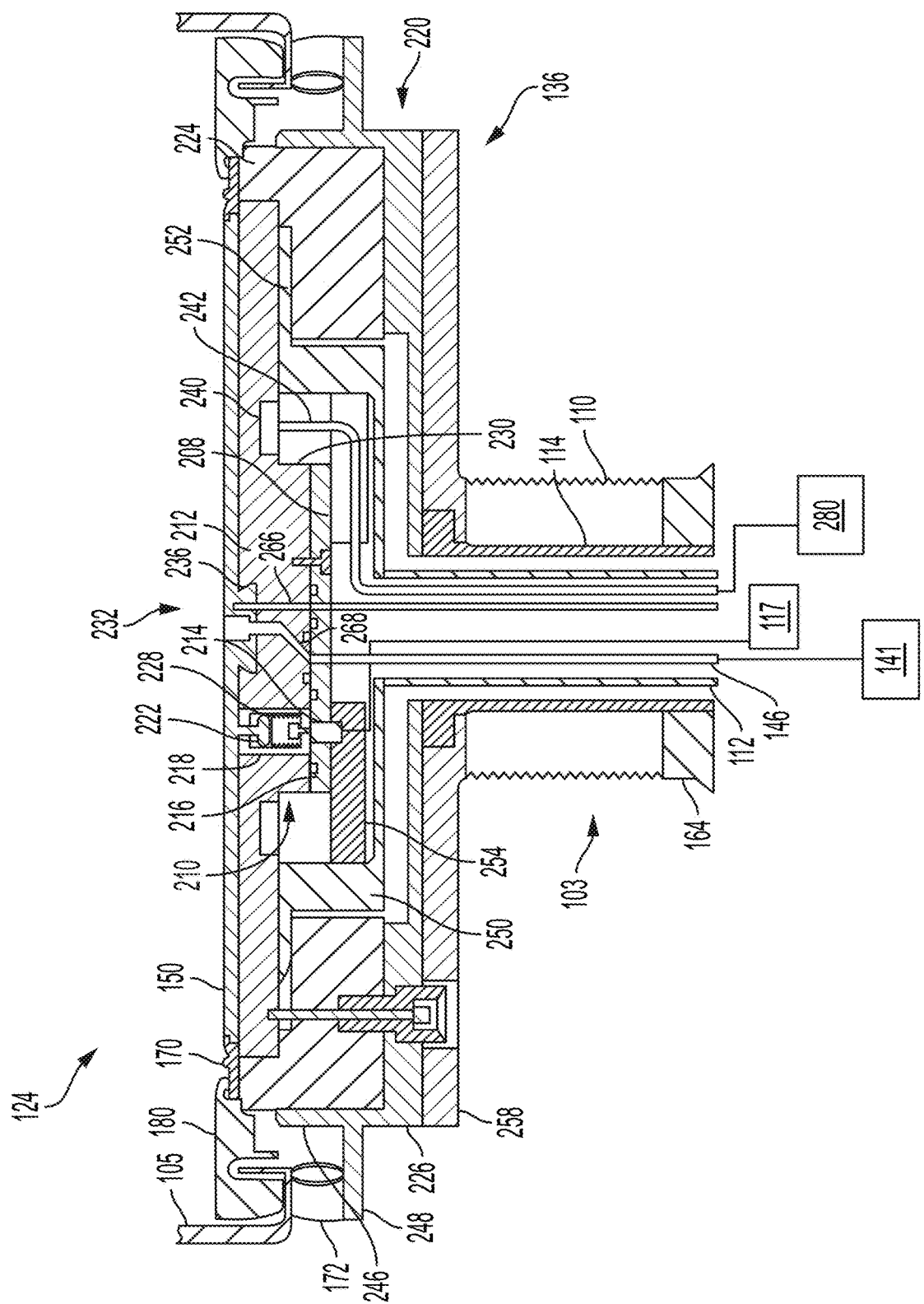
FIG. 2 depicts a schematic side view of the substrate support in accordance with at least some embodiments of the present disclosure.

FIG. 2 depicts a schematic side view of the substrate support 124 in accordance with at least some embodiments of the present disclosure. The pedestal 136 may comprise an upper assembly 210 and a lower assembly 220. The upper assembly 210 generally includes a base plate assembly 208 coupled to a cooling plate 212. In some embodiments, the base plate assembly 208 includes a plurality of electrical feedthroughs 214 coupled to a base plate 216 and extending through openings in the base plate 216.

The cooling plate 212 includes a plurality of openings 218 aligned with the plurality of electrical feedthroughs 214. In some embodiments, the plurality of openings 218 are disposed in a central region of the cooling plate 212. In some embodiments, the central region includes a central protrusion 230 extending from a lower surface of the cooling plate 212. In some embodiments, the plurality of electrical feedthroughs 214 are disposed in the central protrusion 230 of the cooling plate 212. In some embodiments, the central protrusion 230 is disk shaped, and an outer diameter of the central protrusion 230 is substantially similar to an outer diameter of the base plate 216.

The electrostatic chuck 150 is disposed above the upper assembly 210 and removably coupled to the cooling plate 212. In some embodiments, a terminal 222 extends from a lower surface of the electrostatic chuck 150 opposite and aligned with each of the plurality of electrical feedthroughs 214 to electrically couple each of the electrical feedthroughs 214 to an electronic component disposed in the electrostatic chuck 150 (e.g., chucking electrode 154, heater elements 508, or the like). In some embodiments, a flexible connector 228 is disposed in each of the plurality of openings 218 and configured to couple each terminal 222 to each respective one of the plurality of electrical feedthroughs 214. The flexible connector 228 is configured to maintain electrical connection between the terminals 222 and plurality of electrical feedthrough 214 during thermal expansion and/or contraction between the upper assembly 210 and the electrostatic chuck 150. The flexible connector 228 may include a first end 830 (see FIG. 8) having a first opening facing the electrostatic chuck 150 to receive one of the terminals 222 and a second end 832 having a second opening at a second end facing the base plate 216 to receive a conductive core of one of the plurality of electrical feedthroughs 214.

In some embodiments, the electrostatic chuck 150 includes five terminals 222 and the base plate assembly 208 includes five of the plurality of electrical feedthroughs 214, two, or a first pair, for electrically coupling the one or more chucking electrodes 154, two, or a second pair, for a single zone heater, and one for a center tap configured to measure a floating voltage of the substrate 122 when a voltage is applied, for example, when bias voltage or voltage from the RF power source and to the ACT is applied. In some embodiments, the electrostatic chuck 150 includes seven terminals 222, two for the one or more chucking electrodes 154, four for a two-zone heater, and one for a center tap. The electrostatic chuck 150 and the upper assembly 210 may be configured to accommodate more or less than five to seven terminals 222. In some embodiments, a central region 232 of the electrostatic chuck 150 includes an interface ring 236 extending from a lower surface thereof. The terminals 222 may be disposed radially outward about the interface ring 236. In some embodiments, the terminals 222 extend into respective ones of the plurality of openings 218 in the cooling plate 212.

Figure 5:
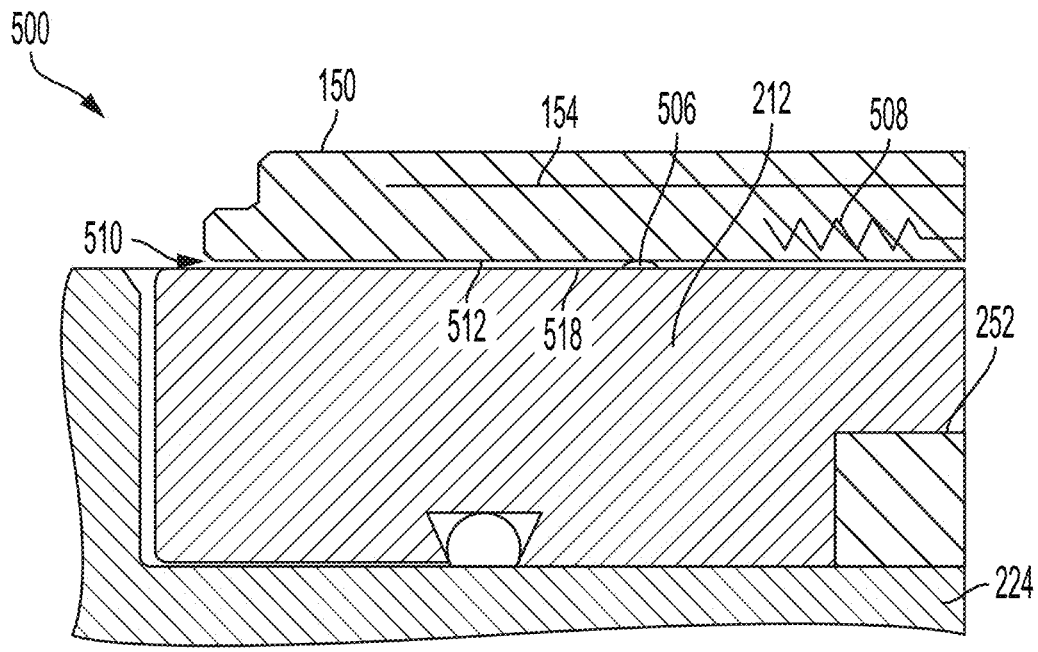
FIG. 5 depicts a cross-sectional side view of a closeup of an upper portion of a substrate support in accordance with at least some embodiments of the present disclosure.

FIG. 5 depicts a cross-sectional side view of a closeup of an upper portion 500 of a substrate support 124 in accordance with at least some embodiments of the present disclosure. One or more heater elements 508 may be disposed in the electrostatic chuck 150 to heat the electrostatic chuck 150 along one or more heating zones. The one or more heater elements 508 are coupled to the heater power supply 160. In some embodiments, a gap 510 is disposed between the electrostatic chuck 150 and the cooling plate 212 to advantageously minimize heat transfer between the electrostatic chuck 150 and the cooling plate 212.

In use, the gap 510 is pumped down via, for example, the vacuum system 184 to create a vacuum gap. The gap 510 is sized large enough to minimize contact heat transfer while small enough to allow RF coupling from the cooling plate 212 to the electrostatic chuck 150 through the gap 510. In some embodiments, the gap 510 is about 0.002 to about 0.006 inches. In some embodiments, the cooling plate 212 includes a plurality of minimum contact area (MCA) pads 506 to support the electrostatic chuck 150. In some embodiments, the plurality of MCA pads 506 comprise about 5 to about 15 MCA pads. In some embodiments, the MCA pads 506 are arranged along two or more concentric circles. For example, in some embodiments, the MCA pads 506 comprise 3 pads along an inner concentric circle and 6 pads along an outer concentric circle. In some embodiments, the MCA pads 506 are arranged along regular intervals. In some embodiments, at least some of the MCA pads 506 are aligned along a common radius of the cooling plate 212.

Figure 6:
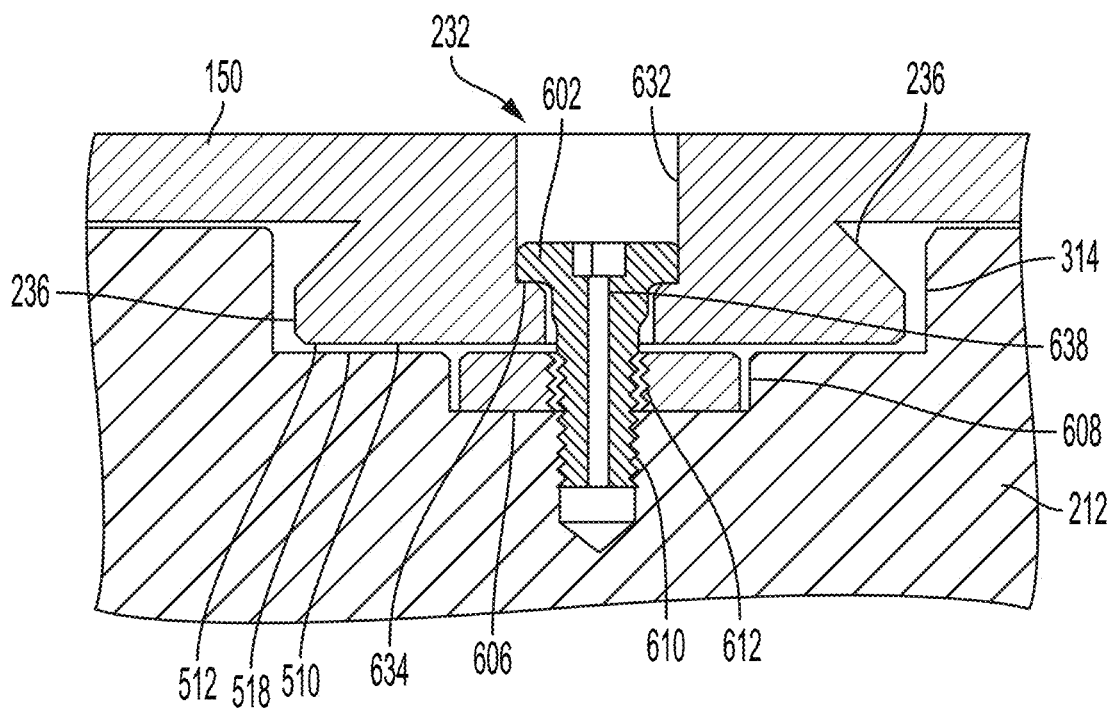
FIG. 6 depicts an interface between an electrostatic chuck and a cooling plate in accordance with at least some embodiments of the present disclosure.

FIG. 6 depicts an interface between an electrostatic chuck 150 and a cooling plate 212 in accordance with at least some embodiments of the present disclosure. The electrostatic chuck 150 is removably coupled from the cooling plate 212 for enhanced replaceability and ease of cleaning. In some embodiments, the electrostatic chuck 150 is coupled to the cooling plate 212 at a central region 232 of the electrostatic chuck 150 such that a lower surface 512 of the electrostatic chuck 150 is spaced from an upper surface 518 of the cooling plate 212. In some embodiments, the electrostatic chuck 150 is coupled to the cooling plate 212 via a fastener 602 that extends through a central through hole 632 of the central region 232 of the electrostatic chuck 150 and into the cooling plate 212. In some embodiments, the central through hole 632 includes a ledge 634 for supporting a head of the fastener 602.

In some embodiments, the fastener 602 secures the electrostatic chuck 150 to the cooling plate 212. In some embodiments, the cooling plate 212 includes a cavity 608 formed in a bottom surface of the central recess 314. In some embodiments, a nut plate 606 is disposed in the cavity 608. In some embodiments, the fastener 602 extends through the nut plate 606 and outer threads of the fastener 602 engage with a threaded opening 610 in the cooling plate 212 to couple the electrostatic chuck 150 to the cooling plate 212.

For detaching the electrostatic chuck 150 from the cooling plate 212, the fastener 602 may be removed. For disengaging the electrical contacts between the electrostatic chuck 150 and the base plate assembly 208, in some embodiments, the nut plate 606 includes inner threads 612 that engages outer threads of a tool (not shown) for lifting up the nut plate 606. When the nut plate 606 is lifted, the nut plate 606 pushes against the electrostatic chuck 150 and disengages all of the electrical contacts. In some embodiments, when the cooling plate 212 includes MCA pads 506, the interface ring 236 of the electrostatic chuck 150 may be spaced from walls of the central recess 314 and the nut plate 606. In some embodiments, when the cooling plate 212 does not include MCA pads 506, the nut plate 606 may provide the only contact region between the electrostatic chuck 150 and the cooling plate 212, advantageously minimizing thermal coupling. In some embodiments, the nut plate 606 may contact the interface ring 236 to support the central region 232 of the electrostatic chuck 150 and the MCA pads 506 may support a peripheral region of the electrostatic chuck 150.

In some embodiments, the central through hole 632 is coupled to the gas conduit 146 for supplying backside gas from the backside gas supply 141 to an upper surface of the electrostatic chuck 150. In some embodiments, the fastener 602 includes a gas passageway 638 disposed therethrough to provide a flow path for the backside gas to the upper surface of the electrostatic chuck 150. A gas plug (not shown) may be disposed in the central through hole 632 above the fastener 602.

Figure 7A:
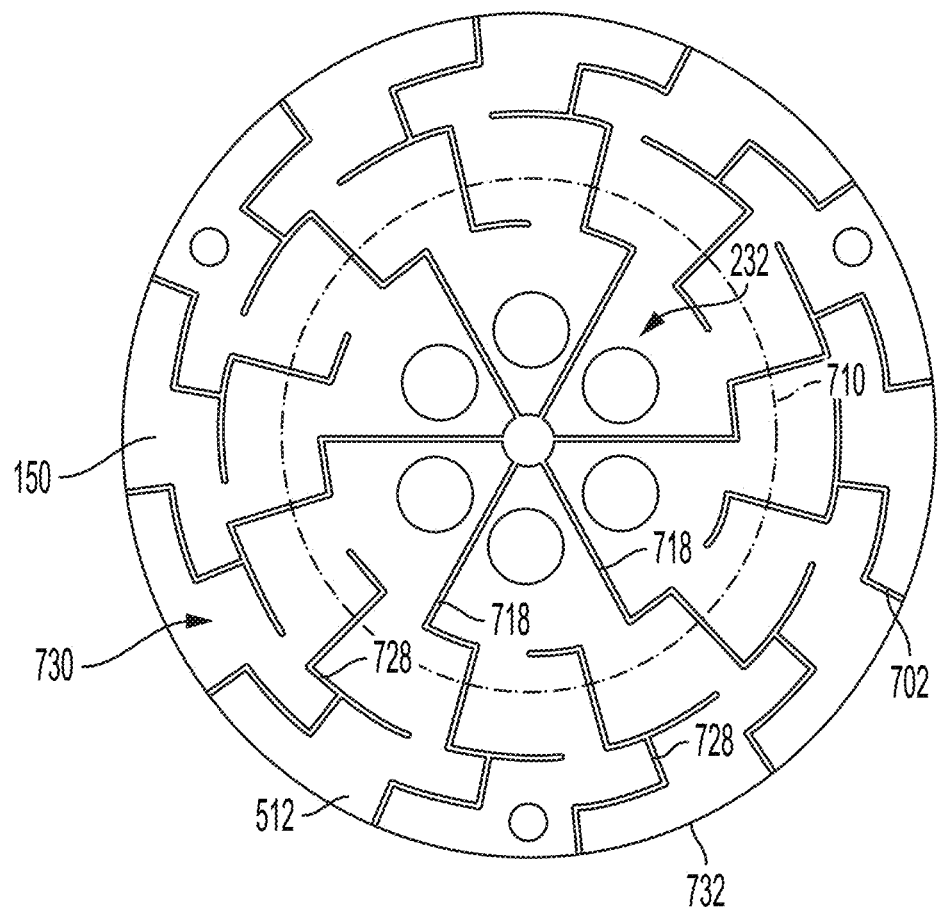
FIG. 7A depicts a backside metallization pattern on a backside of an electrostatic chuck in accordance with at least some embodiments of the present disclosure.
Figure 7B:
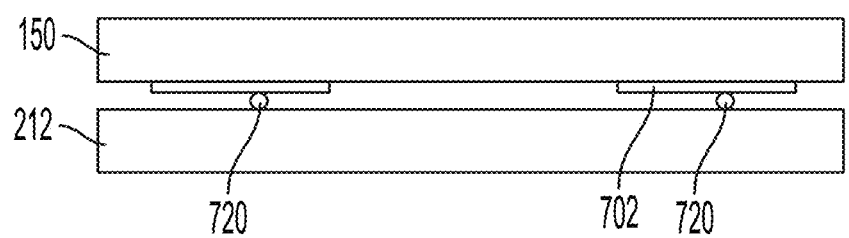
FIG. 7B depicts a schematic side view of an electrostatic chuck with a backside metallization pattern in accordance with at least some embodiments of the present disclosure.

FIG. 7A depicts a backside metallization pattern on a backside of an electrostatic chuck 150 in accordance with at least some embodiments of the present disclosure. FIG. 7B depicts a schematic side view of an electrostatic chuck 150 with a backside metallization pattern in accordance with at least some embodiments of the present disclosure. In some embodiments, RF is coupled from the cooling plate 212 to the electrostatic chuck 150 via a backside metallization 702 of the electrostatic chuck 150 that is physically in contact with the cooling plate 212 to provide RF coupling. The backside metallization 702 may eliminate need for the gap 510 and may improve RF delivery. The backside metallization 702 may comprise any suitable metal for RF coupling.

In some embodiments, one or more RF contacts 720 may be disposed between the backside metallization 702 and the cooling plate 212 so that an RF delivery path extends from the one or more RF contacts 720 to the backside metallization 702 and the backside metallization 702 is not fully in contact with the cooling plate 212, reducing thermal coupling. In some embodiments, the one or more RF contacts are disposed along a ring 710. The backside metallization 702 may comprise any suitable pattern disposed on the lower surface 512 of the electrostatic chuck 150. For example, the backside metallization 702 may comprise a plurality of branches 718 extending from a central region 232 to an outer region 730 or outer surface 732 of the electrostatic chuck 150. In some embodiments, the plurality of branches 718 extend in a non-linear manner. In some embodiments, a second plurality of branches 728 are disposed between the plurality of branches 718 in the outer region 730. In some embodiments, there is one of the one or more RF contacts 720 for each plurality of branches 718 and each second plurality of branches 728.

Returning back to FIG. 2, the support assembly 103 includes an inner tube 112 coupled to the cooling plate 212 and configured to provide an RF delivery path to the electrostatic chuck 150 via at least one of: the gap 510 between the electrostatic chuck 150 and the cooling plate 212 or the backside metallization 702 of the electrostatic chuck 150. The gas conduit 146 extends through the inner tube 112. In some embodiments, the backside gas supply 141 is fluidly coupled to the lower surface 512 of the electrostatic chuck 150 via the gas conduit 146 of the base plate assembly 208, a gas opening 268 through the cooling plate 212, and the central through hole 632 of the electrostatic chuck 150. In some embodiments, a temperature measurement device 266 extends through the inner tube 112. In some embodiments, the temperature measurement device 266 extends through the base plate 216 and through the cooling plate 212 into the electrostatic chuck 150. In some embodiments, the temperature measurement device 266 extends into the interface ring 236 of the electrostatic chuck 150. In some embodiments, the temperature measurement device 266 extends through the central protrusion 230 of the cooling plate 212. The temperature measurement device 266 may be a thermocouple, an optic temperature measurement device, or the like.

In some embodiments, the lower assembly 220 of the pedestal 136 includes a ceramic block 224 disposed on a housing 226 of the lower assembly 220. In some embodiments, the housing 226 includes an outer lip 246 that surrounds the ceramic block 224. In some embodiments, the housing 226 includes an outer ledge 248 that extends radially outward from the outer lip 246. The outer ledge 248 may provide a coupling surface for the plurality of ground loops 172. The housing 226 is coupled to the outer tube 114. In some embodiments, the housing 226 is disposed on a bellows weldment 258 that is coupled to the bellows assembly 110.

In some embodiments, the cooling plate 212 includes coolant channel 240 for circulating a cooling therein to control a temperature of the electrostatic chuck 150. A coolant supply line 242 may extend from a coolant supply 280 to the coolant channel 240. In some embodiments, the coolant supply line 242 extends through the inner tube 112. The cooling plate 212 is discussed in more detail below with respect to FIGS. 3 and 4.

In some embodiments, the lower assembly 220 of the pedestal 136 includes an RF delivery tray 250 coupled to the inner tube 112 at a lower end and to the cooling plate 212 at an upper end. In some embodiments, the RF delivery tray 250 has a bowl-like shape extends from the inner tube 112 to proximate the ceramic block 224. In some embodiments, the base plate 216 and the central protrusion 230 of the cooling plate 212 may be disposed within the RF delivery tray 250. In some embodiments, the RF delivery tray 250 includes and outer lip 252 that extends radially outward from an upper portion of the RF delivery tray 250. In some embodiments, the outer lip 252 is disposed between the cooling plate 212 and the ceramic block 224. In some embodiments, the lower assembly 220 includes a cover plate 254 coupled to the base plate 216 within the RF delivery tray 250 and configured to cover the plurality of electrical feedthroughs 214. In some embodiments, the cover plate 254 is made of a polymer material.

In some embodiments, an RF delivery path extends from the inner tube 112 to the RF delivery tray 250 to outer surfaces of the cooling plate 212 to the upper surface 518 of the cooling plate 212 and to the electrostatic chuck 150. In some embodiments, an RF return path extends from the processing volume 119 to upper surfaces of the housing 226 to the outer tube 114. The ceramic block 224 is configured to electrically isolate the RF delivery path and the RF return path. In some embodiments, the housing 226 is made of a metal, such as aluminum. In some embodiments, the inner tube 112 is made of metal, such as aluminum.

Figure 3:
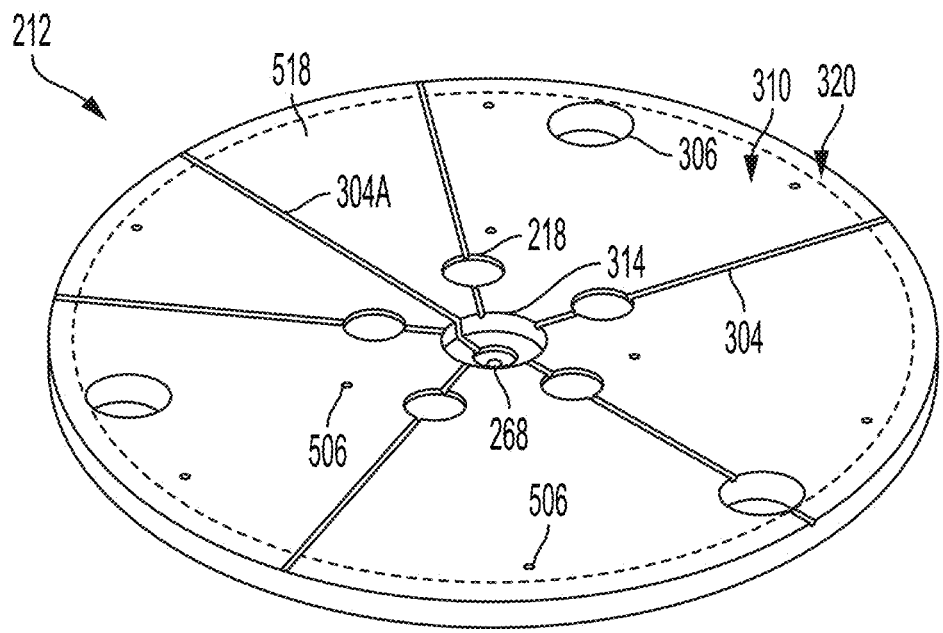
FIG. 3 depicts an isometric top view of a cooling plate in accordance with as least some embodiments of the present disclosure.

FIG. 3 depicts an isometric top view of a cooling plate 212 in accordance with at least some embodiments of the present disclosure. In some embodiments, the cooling plate 212 is made of stainless steel or aluminum. In some embodiments, the upper surface 518 of the cooling plate 212 has varying emissivity as desired to control heat loss. For example, the upper surface 518 may have higher emissivity at a central portion 310 than at a peripheral portion 320 to further aid in controlling temperature uniformity across the electrostatic chuck 150. The higher emissivity may be achieved via any suitable process, for example, by machining, gritting, anodizing, or the like.

The cooling plate 212 may include a plurality of radially channels 304 on the upper surface 518 thereof to aid in evacuating air disposed between the cooling plate 212 and the electrostatic chuck 150 to create a vacuum therebetween. In some embodiments, the upper surface 518 includes a central recess 314 to accommodate the interface ring 236 of the electrostatic chuck 150. In some embodiments, one radial channel 304A of the plurality of radial channels 304 may extend into the central recess 314 to aid in evacuating air disposed between the interface ring 236 and the cooling plate 212. In some embodiments, the plurality of radial channels 304 comprise six channels. In some embodiments, the plurality of radial channels 304 extend through the openings 218 for the plurality of electrical feedthroughs 214. The cooling plate 212 may include openings 306 to accommodate the lift pins 109.

Figure 4:
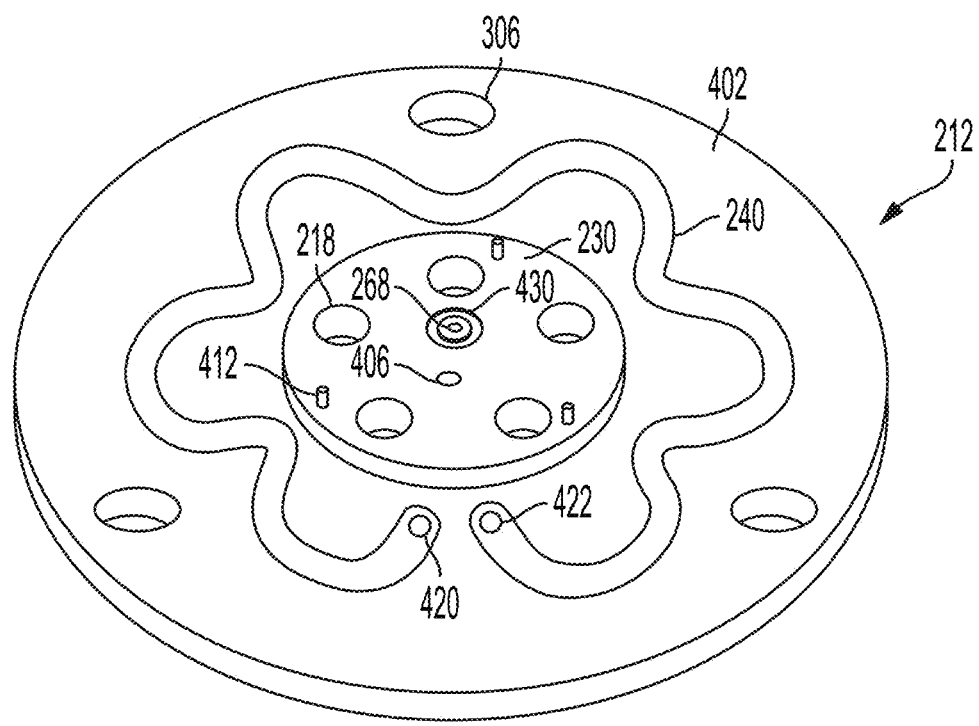
FIG. 4 depicts an isometric bottom view of a cooling plate in accordance with at least some embodiments of the present disclosure.

FIG. 4 depicts an isometric bottom view of a cooling plate 212 in accordance with at least some embodiments of the present disclosure. In some embodiments, a lower surface 402 of the cooling plate 212 includes the central protrusion 230 and the coolant channel 240 disposed about the central protrusion 230. The coolant channel 240 may extend along any suitable path for cooling the cooling plate 212. In some embodiments, the coolant channel 240 extends in a wavy or non-circular manner. In some embodiments, the coolant channel 240 includes an inlet 420 and an outlet 422. In some embodiments, the cooling plate 212 includes one or more alignment features 412 for aligning the cooling plate 212 with the base plate 216. In some embodiments, the central protrusion 230 includes an opening 406 for the temperature measurement device 266. In some embodiments, the gas opening 268 through the cooling plate 212 may include one or more bends to provide adequate separation between the gas opening 268 and the temperature measurement device 266. An o-ring groove 430 may be disposed about the gas opening 268 to seal the gas opening 268.

Figure 8:
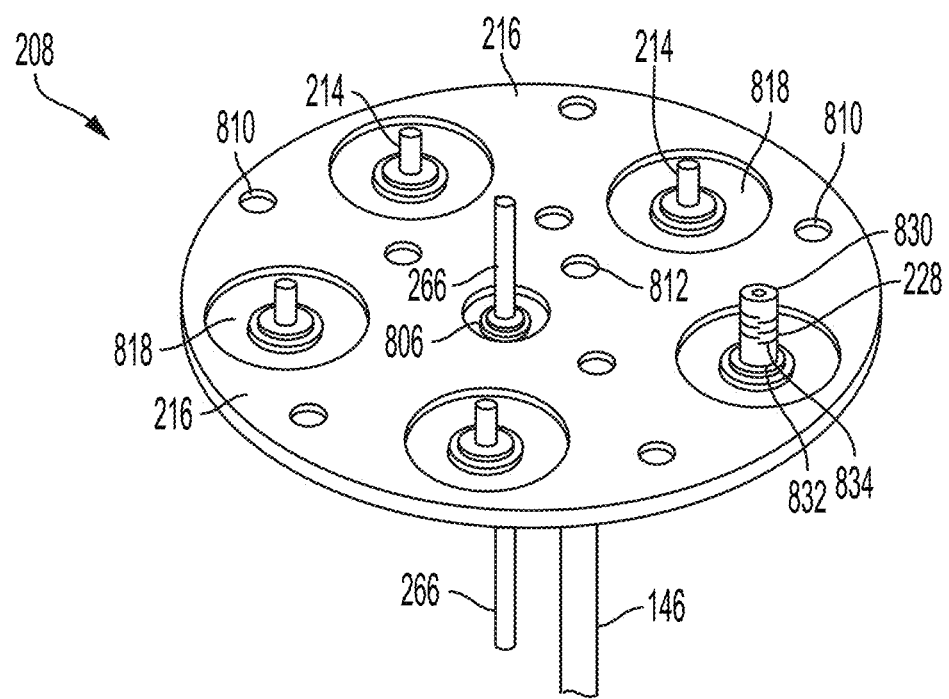
FIG. 8 depicts an isometric top view of a base plate in accordance with at least some embodiments of the present disclosure.

FIG. 8 depicts an isometric top view of the base plate assembly 208 in accordance with at least some embodiments of the present disclosure. In some embodiments, the base plate 216 of the base plate assembly 208 includes a plurality of fastener openings 810 for coupling the base plate 216 to the cooling plate 212. The base plate 216 includes a gas opening 812 coupled to the gas conduit 146. The gas opening 812 is aligned with the gas opening 268 of the cooling plate 212. In some embodiments, the plurality of electrical feedthroughs 214 may be disposed proximate an outer surface of the base plate 216. An o-ring groove 818 may be disposed about each of the plurality of electrical feedthroughs 214 to seal the plurality of openings 218 of the cooling plate 212. An o-ring groove 806 may be disposed about the temperature measurement device 266. FIG. 8 depicts one of the flexible connectors 228. In some embodiments, the flexible connectors 228 include a plurality of slits 834 to allow the first end 830 to move with respect to the second end 832.

While the foregoing is directed to embodiments of the present disclosure, other and further embodiments of the disclosure may be devised without departing from the basic scope thereof.

The invention claimed is:

1. A substrate support for use in a substrate processing chamber, comprising:
   an upper assembly having a base plate assembly coupled to a lower surface of a cooling plate, wherein the base plate assembly includes a plurality of electrical feedthroughs, and wherein the cooling plate includes a plurality of openings aligned with the plurality of electrical feedthroughs;
   an electrostatic chuck disposed on the upper assembly and removably coupled to the cooling plate, wherein the electrostatic chuck has a chucking electrode disposed therein that is electrically coupled to a first pair of electrical feedthroughs of the plurality of electrical feedthroughs; and
   an inner tube coupled to the cooling plate and configured to provide an RF delivery path to the electrostatic chuck via at least one of: a gap between the electrostatic chuck and the cooling plate, or backside metallization of the electrostatic chuck;
   wherein at least one of:
   the electrostatic chuck is coupled to the cooling plate at a central region of the electrostatic chuck such that a lower surface of the electrostatic chuck is spaced from an upper surface of the cooling plate, or
   further comprising an outer tube disposed about the inner tube, and a lower assembly having a ceramic block disposed on a housing, wherein the outer tube is coupled to the housing to provide an RF return path, and wherein the ceramic block is disposed between the housing and the cooling plate to isolate the RF delivery path from the RF return path, or
   the electrostatic chuck has an interface ring extending from a lower surface of the electrostatic chuck, wherein the interface ring includes a central through hole that is fluidly coupled to an opening in the cooling plate and configured to flow backside gas therethrough, or
   a thermocouple is disposed through a central protrusion of the cooling plate and extends into the electrostatic chuck, or
   further comprising a flexible connector that includes an opening at a first end to receive a terminal extending from a lower surface of the electrostatic chuck and an opening at a second end to receive a conductive core of one of the plurality of electrical feedthroughs, or
   wherein a lower surface of the cooling plate includes a central protrusion and a coolant channel disposed about the central protrusion.

2. The substrate support of claim 1, wherein the electrostatic chuck is coupled to the cooling plate at the central region of the electrostatic chuck such that the lower surface of the electrostatic chuck is spaced from the upper surface of the cooling plate.

3. The substrate support of claim 1,
   wherein the outer tube is disposed about the inner tube; and
   the lower assembly has the ceramic block disposed on the housing, wherein the outer tube is coupled to the housing to provide the RF return path, and wherein the ceramic block is disposed between the housing and the cooling plate to isolate the RF delivery path from the RF return path.

4. The substrate support of claim 1, wherein the electrostatic chuck has the interface ring extending from the lower surface of the electrostatic chuck, wherein the interface ring includes the central through hole that is fluidly coupled to the opening in the cooling plate and configured to flow backside gas therethrough.

5. The substrate support of claim 1, wherein the cooling plate is made of stainless steel or aluminum.

6. The substrate support of claim 1, wherein the thermocouple is disposed through the central protrusion of the cooling plate and extends into the electrostatic chuck.

7. The substrate support of claim 1, wherein the flexible connector includes the opening at the first end to receive the terminal extending from the lower surface of the electrostatic chuck and the opening at the second end to receive the conductive core of one of the plurality of electrical feedthroughs.

8. The substrate support of claim 1, wherein the lower surface of the cooling plate includes the central protrusion and the coolant channel disposed about the central protrusion.

9. The substrate support of claim 8, wherein an outer diameter of the central protrusion is substantially similar to an outer diameter of the base plate assembly.

10. A substrate support for use in a substrate processing chamber, comprising:
    an upper assembly having a base plate assembly coupled to a cooling plate, wherein the base plate assembly includes a plurality of electrical feedthroughs disposed about a backside gas opening, and wherein the cooling plate includes a plurality of openings aligned with the plurality of electrical feedthroughs;
    an electrostatic chuck disposed on the upper assembly and removably coupled to the cooling plate, wherein the electrostatic chuck has an electrode disposed therein that is electrically coupled to a first pair of electrical feedthroughs of the plurality of electrical feedthroughs;
    an inner tube coupled to the cooling plate and configured to provide an RF delivery path to the electrostatic chuck via at least one of: a gap between the electrostatic chuck and the cooling plate, or backside metallization of the electrostatic chuck; and
    a first resistive heater embedded in the electrostatic chuck and electrically coupled to a second pair of the electrical feedthroughs;
    wherein at least one of:
    an upper surface of the cooling plate has a higher emissivity at a central portion than at a peripheral portion, or
    a lower surface of the electrostatic chuck includes a metallization pattern to provide RF contact with the cooling plate, or a lower surface of the electrostatic chuck includes an interface ring and five terminals disposed about the interface ring and aligned with the plurality of electrical feedthroughs, or the electrostatic chuck is coupled to the cooling plate via a fastener that extends through a central region of the electrostatic chuck, wherein the fastener extends through a nut plate and outer threads of the fastener engage with a threaded opening in the cooling plate to couple the electrostatic chuck to the cooling plate.

11. The substrate support of claim 10, wherein the upper surface of the cooling plate has the higher emissivity at the central portion than at the peripheral portion.

12. The substrate support of claim 10, wherein the lower surface of the electrostatic chuck includes the metallization pattern to provide RF contact with the cooling plate.

13. The substrate support of claim 10, wherein the lower surface of the electrostatic chuck includes the interface ring and five terminals disposed about the interface ring and aligned with the plurality of electrical feedthroughs.

14. The substrate support of claim 10, wherein the electrostatic chuck is coupled to the cooling plate via the fastener that extends through the central region of the electrostatic chuck, wherein the fastener extends through the nut plate and outer threads of the fastener engage with the threaded opening in the cooling plate to couple the electrostatic chuck to the cooling plate.

15. A process chamber, comprising:
- a chamber body having a substrate support disposed within an inner volume of the chamber body, wherein the substrate support comprises:
  - an upper assembly having a base plate assembly coupled to a cooling plate, wherein the base plate assembly includes a plurality of electrical feedthroughs disposed about a backside gas opening, and wherein the cooling plate includes a plurality of openings aligned with the plurality of electrical feedthroughs;
  - an electrostatic chuck disposed on the upper assembly and removably coupled to the cooling plate, wherein the electrostatic chuck has an electrode disposed therein that is electrically coupled to a first pair of electrical feedthroughs of the plurality of electrical feedthroughs; and
  - a support assembly having an inner tube coupled to the cooling plate and configured to provide an RF delivery path to the electrostatic chuck via at least one of:
    - a gap between the electrostatic chuck and the cooling plate, or
    - backside metallization of the electrostatic chuck;
  - wherein at least one of:
    - further comprising a lower assembly that includes a ceramic block disposed on a housing, wherein the housing includes an outer lip that surrounds the ceramic block; or
    - the plurality of electrical feedthroughs are disposed in a central protrusion of the cooling plate, or
    - a flexible connector is disposed between the electrostatic chuck and each electrical feedthrough to allow for thermal expansion of the electrostatic chuck while maintaining electrical coupling.

16. The process chamber of claim 15, wherein the lower assembly includes the ceramic block disposed on the housing, wherein the housing includes the outer lip that surrounds the ceramic block.

17. The process chamber of claim 16, further comprising a process shield disposed about the substrate support, wherein a plurality of ground loops are coupled to the housing and configured to contact the process shield when the substrate support is in an upper, processing position.

18. The process chamber of claim 15, wherein the plurality of electrical feedthroughs are disposed in the central protrusion of the cooling plate.

19. The process chamber of claim 15, further comprising a backside gas supply fluidly coupled to a lower surface of the electrostatic chuck via a central through hole of the electrostatic chuck and a gas conduit of the base plate assembly.

20. The process chamber of claim 15, wherein the a flexible connector is disposed between the electrostatic chuck and each electrical feedthrough to allow for thermal expansion of the electrostatic chuck while maintaining electrical coupling.

* * * * *